United States Patent
You et al.

(10) Patent No.: US 10,490,764 B2
(45) Date of Patent: Nov. 26, 2019

(54) ORGANIC ELECTROLUMINESCENT DEVICE AND DISPLAY DEVICE

(71) Applicant: BOE TECHNOLOGY GROUP CO., LTD., Beijing (CN)

(72) Inventors: Juanjuan You, Beijing (CN); Chinlung Liao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 42 days.

(21) Appl. No.: 15/737,217

(22) PCT Filed: Jun. 23, 2017

(86) PCT No.: PCT/CN2017/089719
§ 371 (c)(1),
(2) Date: Dec. 15, 2017

(87) PCT Pub. No.: WO2018/040686
PCT Pub. Date: Mar. 8, 2018

(65) Prior Publication Data
US 2018/0375047 A1 Dec. 27, 2018

(30) Foreign Application Priority Data

Aug. 31, 2016 (CN) .......................... 2016 1 0793761

(51) Int. Cl.
*H01L 51/50* (2006.01)
*H01L 27/32* (2006.01)
*H01L 51/00* (2006.01)

(52) U.S. Cl.
CPC ........ *H01L 51/504* (2013.01); *H01L 27/3211* (2013.01); *H01L 51/5004* (2013.01);
(Continued)

(58) Field of Classification Search
CPC ... H01L 51/504; H01L 51/50; H01L 51/5016; H01L 51/5004
See application file for complete search history.

(56) References Cited

U.S. PATENT DOCUMENTS

2009/0294778 A1 12/2009 Mitsuya
2011/0101398 A1 5/2011 Uchida
(Continued)

FOREIGN PATENT DOCUMENTS

CN 101447555 A 6/2009
CN 102130306 A 7/2011
(Continued)

OTHER PUBLICATIONS

Office Action received for Chinese Patent Application No. 201610793761.6, dated Jul. 26, 2017, 9 pages (4 pages of English Translation and 5 pages of Office Action).
(Continued)

*Primary Examiner* — Douglas M Menz
(74) *Attorney, Agent, or Firm* — Womble Bond Dickinson (US) LLP (57) ABSTRACT

The present disclosure provides an organic electroluminescent device and a display device. The material of the blue light emitting layer in the organic electroluminescent device comprises an electron transport material and a hole transport material that can form a blue light exciplex. The proportions respectively occupied by the electron transport material and the hole transport material of the blue light emitting layer in all materials of the blue light emitting layer match with the abilities of the red light emitting layer and the green light emitting layer to transport electrons, so that electrons and holes would not recombine within and at an edge of the portion of the blue light emitting layer that covers the red light emitting layer and the green light emitting layer when
(Continued)

the red light emitting layer and/or the green light emitting layer is required to emit light.

16 Claims, 3 Drawing Sheets

(52) U.S. Cl.
CPC ...... *H01L 51/0061* (2013.01); *H01L 51/0067* (2013.01); *H01L 51/0072* (2013.01); *H01L 51/5016* (2013.01); *H01L 51/5056* (2013.01); *H01L 51/5072* (2013.01); *H01L 2251/552* (2013.01); *H01L 2251/558* (2013.01)

(56) References Cited

U.S. PATENT DOCUMENTS

| | | |
|---|---|---|
| 2011/0193476 A1 | 8/2011 | Higo et al. |
| 2013/0048969 A1 | 2/2013 | Sudo |
| 2013/0168652 A1 | 7/2013 | Nam et al. |
| 2015/0014667 A1 | 1/2015 | Li et al. |
| 2015/0162559 A1 | 6/2015 | Wu |
| 2017/0040561 A1 | 2/2017 | Wu et al. |

FOREIGN PATENT DOCUMENTS

| | | |
|---|---|---|
| CN | 102148334 A | 8/2011 |
| CN | 102969332 A | 3/2013 |
| CN | 103187429 A | 7/2013 |
| CN | 103325952 A | 9/2013 |
| CN | 103682116 A | 3/2014 |
| CN | 105185917 A | 12/2015 |
| CN | 106159101 A | 11/2016 |
| JP | 2009-093982 A | 4/2009 |
| JP | 5194700 B2 | 5/2013 |

OTHER PUBLICATIONS

International Search Report received for PCT Patent Application No. PCT/CN2017/089719, dated Sep. 11, 2017, 6 pages (2 pages of English Translation and 4 pages of Original Document).

ORGANIC ELECTROLUMINESCENT DEVICE AND DISPLAY DEVICE

The present application is the U.S. national phase entry of PCT/CN2017/089719, with an international filing date of Jun. 23, 2017, which claims the benefit of Chinese Patent Application No. 201610793761.6, filed on Aug. 31, 2016, the entire disclosure of which is incorporated herein by reference.

TECHNICAL FIELD

The present disclosure relates to the field of organic electroluminescent technology, particularly to an organic electroluminescent device and a display device.

BACKGROUND

The active-matrix organic light emitting diode (AMO-LED) display device has been widely applied in televisions and mobile device products owing to advantages such as wide visual angle, high colour gamut, and high response speed etc.

It was found in practical tests and applications that the organic electroluminescent device in the art that comprises a light emitting unit produced by a hybrid process may generally have such a problem. That is, when the red light emitting layer and/or the green light emitting layer is required to emit light, a portion of the blue light emitting layer that covers the red light emitting layer and the green light emitting layer will also emit light.

SUMMARY

An object of the present disclosure lies in providing an organic electroluminescent device and a display device comprising the organic electroluminescent device, so as to solve problems such as that in the light emitting unit produced by a hybrid process, when the red light emitting layer and/or the green light emitting layer is required to emit light, a portion of the blue light emitting layer that covers the red light emitting layer and the green light emitting layer will also emit light.

According to one aspect of the present disclosure, an organic electroluminescent device is provided, comprising an anode and a cathode arranged oppositely, as well as a light emitting unit that is arranged between the anode and the cathode and is formed by a hybrid process. The light emitting unit comprises a red light emitting layer, a green light emitting layer and a blue light emitting layer. The blue light emitting layer comprises a first portion and a second portion. The first portion of the blue light emitting layer covers the red light emitting layer and the green light emitting layer that are arranged side by side, and the second portion of the blue light emitting layer is arranged side by side with the red light emitting layer and the green light emitting layer. A material of the blue light emitting layer comprises an electron transport material and a hole transport material that can form a blue light exciplex. Proportions respectively occupied by the electron transport material and the hole transport material of the blue light emitting layer in all materials of the blue light emitting layer match with the abilities of the red light emitting layer and the green light emitting layer to transport electrons, so that electrons and holes would not recombine within and at an edge of the first portion of the blue light emitting layer when the red light emitting layer and/or the green light emitting layer is required to emit light.

In the organic electroluminescent device according to the present disclosure, the material of the blue light emitting layer comprises an electron transport material and a hole transport material that can form a blue light exciplex, and the proportions respectively occupied by the electron transport material and the hole transport material of the blue light emitting layer in all materials of the blue light emitting layer match with the abilities of the red light emitting layer and the green light emitting layer to transport electrons, so that electrons can be transported from the cathode to the red light emitting layer and/or the green light emitting layer quickly when the red light emitting layer and/or the green light emitting layer is required to emit light. This ensures that the electrons and the holes can only meet and recombine within the red light emitting layer and/or within the green light emitting layer, but would not recombine within and at the edge of a portion of the blue light emitting layer that covers the red light emitting layer and the green light emitting layer. Further, this helps to avoid the problem that when the red light emitting layer and/or the green light emitting layer is required to emit light, a portion of the blue light emitting layer that covers the red light emitting layer and the green light emitting layer will also emit light.

According to another aspect of the present disclosure, a display device is provided, comprising the organic electroluminescent device according to the present disclosure.

BRIEF DESCRIPTION OF THE DRAWINGS

The drawings explained here are used for providing further understanding of the present disclosure, and constitute a part of the present disclosure. The schematic embodiments of the present disclosure and the illustration thereof are used for explaining the present disclosure, but do not constitute inappropriate definitions to the present disclosure. In the drawings.

DETAILED DESCRIPTION OF THE EMBODIMENTS

In order further to explain the organic electroluminescent device and the display device provided by the embodiments of the present disclosure, next, they will be described in detail in conjunction with the drawings.

At present, the AMOLED display devices mostly use full evaporation process to realize large-scale production. Moreover, realizing full color display through the full evaporation process generally uses the RGB arrangement manner, and such a RGB arrangement manner uses fine metal shadow mask (FMM) to define pixels of different colors. However, such a manner is limited by the size of FMM and cannot realize large size display.

In order to realize large size display, when manufacturing AMOLED display devices in the art, a solution process is introduced. Such a solution process has advantages in the aspect of RGB patterning. Also, the red phosphor material and the green phosphor material in the solution have reached the level of small evaporation molecular materials. That is, the red light emitting layer and the green light emitting layer can be manufactured through ink-jetting and printing etc., thereby avoiding the problem that sizes of the red light emitting layer and the green light emitting layer manufactured using FMM are limited. However, there are few choices for the blue light material of the solution, and FMM is not used. Therefore, in the prior art, the blue light emitting layer is manufactured through a vacuum evaporation process and using a structure of whole layer covering, thereby being capable of realizing a large size AMOLED display device.

In order to ensure that the light emitting layers comprised by the AMOLED display device manufactured through a hybrid process that includes both the solution process and the evaporation process can all emit light separately, and have a better light emitting effect, a hybrid connecting layer (HCL) has to be introduced in the AMOLED display device. In this way, the structure of each organic electroluminescent device in the AMOLED display device generally comprises: an anode and a cathode arranged oppositely, as well as a red light emitting layer, a green light emitting layer, a HCL and a blue light emitting layer arranged between the anode and the cathode. The red light emitting layer and the green light emitting layer are arranged side by side, a first portion of the HCL covers the red light emitting layer and the green light emitting layer, and a second portion of the HCL is arranged side by side with the red light emitting layer and the green light emitting layer. The red light emitting layer and the green light emitting layer are closer to the anode than the first portion of the HCL. The blue light emitting layer correspondingly comprises a first portion and a second portion, wherein the first portion of the blue light emitting layer covers the first portion of the HCL, and the second portion of the blue light emitting layer covers the second portion of the HCL. The blue light emitting layer is closer to the cathode than the HCL.

The HCL in the above structure is a hole transport layer for the blue light emitting layer, while is an electron transport layer for the red light emitting layer and the green light emitting layer. In addition, the HCL can also limit the triplet state exciton corresponding to each light emitting layer into the respective light emitting layer, which improves the light emitting efficiency of each light emitting layer. However, it was found in practical tests and applications that the organic electroluminescent device of the above structure may generally has problems such as that when only the red light emitting layer and/or the green light emitting layer is required to emit light, the first portion of the blue light emitting layer will also emit light.

The inventor of the present disclosure found from studies that the such a problem is due to the fact that materials of the HCL in the organic electroluminescent device of the AMO-LED display device are not selected appropriately, such that when the red light emitting layer and/or the green light emitting layer is required to emit light, electrons from the cathode cannot be transported to the red light emitting layer and/or the green light emitting layer timely and quickly. Thus, these electrons and the holes from the anode meet and recombine within and/or at an edge of the first portion of the blue light emitting layer, causing the first portion of the blue light emitting layer to emit light.

It is found from further studies that the transport speed of the electrons and the holes in the organic electroluminescent device can be controlled by adjusting the proportions of the electron transport material for transporting electrons and the hole transport material for transporting holes within each organic electroluminescent device of the AMOLED display device. This helps to ensure that the electrons can be transported into the red light emitting layer and/or the green light emitting layer more quickly when the red light emitting layer and/or the green light emitting layer is required to emit light, such that the electrons and the holes recombines within the red light emitting layer and/or the green light emitting layer, preventing the first portion of the blue light emitting layer from emitting light.

Figure 1:
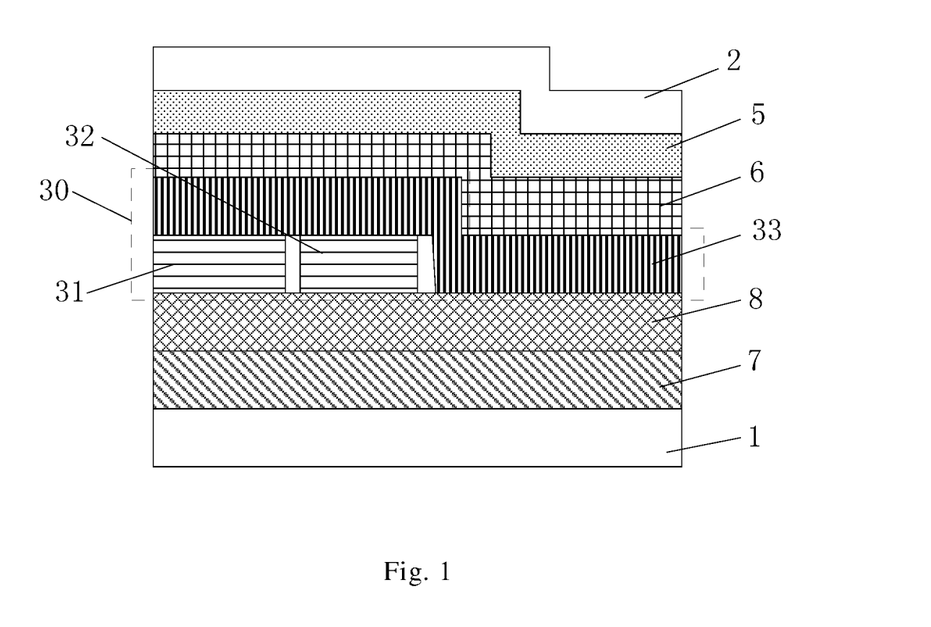
FIG. 1 is a structural schematic view for an organic electroluminescent device according to an embodiment of the present disclosure.

FIG. 1 is a structural schematic view for an organic electroluminescent device according to an embodiment of the present disclosure.

Referring to FIG. 1, the organic electroluminescent device according to an embodiment of the present disclosure comprises an anode 1 and a cathode 2 arranged oppositely, as well as a light emitting unit 30 that is arranged between the anode 1 and the cathode 2 and formed by a hybrid process. The light emitting unit 30 comprises a blue light emitting layer 33, as well as a red light emitting layer 31 and a green light emitting layer 32 arranged side by side. The blue light emitting layer 33 comprises a first portion and a second portion. The first portion of the blue light emitting layer 33 covers the red light emitting layer 31 and the green light emitting layer 32, and the first portion of the blue light emitting layer 33 is closer to the cathode 2 than the red light emitting layer 31 and the green light emitting layer 32. The second portion of the blue light emitting layer 33 is arranged side by side with the red light emitting layer 31. The material of the blue light emitting layer 33 comprises an electron transport material and a hole transport material that can form a blue light exciplex 4.

The proportions respectively occupied by the electron transport material and the hole transport material of the blue light emitting layer 33 in all materials of the blue light emitting layer 33 match with the abilities of the red light emitting layer 31 and the green light emitting layer 32 to transport electrons, so that electrons and holes would not recombine within and at an edge of the first portion of the blue light emitting layer 33 when the red light emitting layer and/or the green light emitting layer is required to emit light.

The working process for the organic electroluminescent device according to an embodiment of the present disclosure is as follows. A positive voltage is applied at the anode 1, and a negative voltage is applied at the cathode 2. In this case, the electrons are transported from the cathode 2 to the blue light emitting layer 33, and further transported to the red light emitting layer 31 and the green light emitting layer 32 via the first portion of the blue light emitting layer 33. Similarly, the holes are transported from the anode 1 to the red light emitting layer 31, the green light emitting layer 32 and the blue light emitting layer 33. That is, the second portion of the blue light emitting layer 33 can receive the holes from the anode 1 via no red light emitting layer 31 and no green light emitting layer 32. The electrons and the holes recombine in the red light emitting layer 21, so as to enable the red light emitting layer 31 to emit red light. Also, the electrons and the holes recombine in the green light emitting layer 32, so as to enable the green light emitting layer 32 to emit green light. Next, the light emitting principle for the blue light emitting layer will be explained with reference to FIG. 2.

Figure 2:
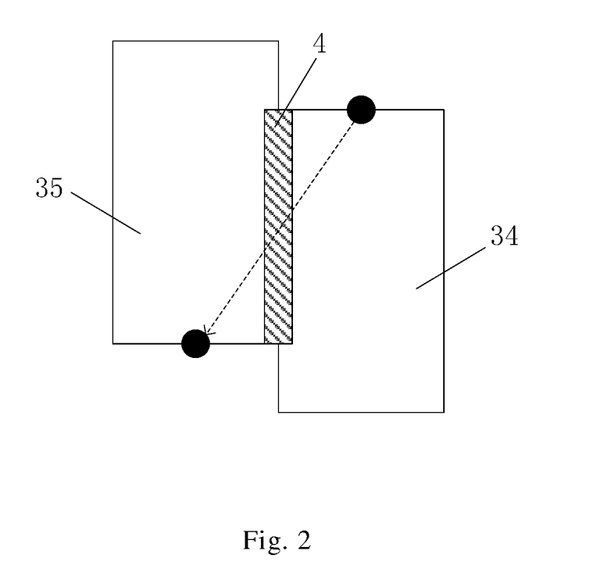
FIG. 2 is a schematic view for the light emitting principle of the blue light emitting layer in the organic electroluminescent device according to an embodiment of the present disclosure.

FIG. 2 is a schematic view for the light emitting principle of the blue light emitting layer in the organic electroluminescent device according to an embodiment of the present disclosure.

Referring to FIG. 2, the black dot in the first molecule 34 in FIG. 2 represents an electron, and the black dot in the second molecule 35 represents a hole. The electron and the hole are transported into the blue light emitting layer 33, wherein the electron transitions from the lowest unoccupied molecular orbital of the first molecule 34 (a molecule corresponding to the electron transport material) to the highest occupied molecular orbital of the second molecule 35 (a molecule corresponding to the hole transport material) in the blue light emitting layer 33, and recombines with the hole to form an exciton, causing the blue light exciplex 4 formed between the first molecule 34 and the second molecule 35 to emit blue light.

In the organic electroluminescent device according to an embodiment of the present disclosure, the material of the blue light emitting layer 33 comprises an electron transport material and a hole transport material that can form a blue light exciplex 4. Further, the proportions respectively occupied by the electron transport material and the hole transport material of the blue light emitting layer 33 in all materials of the blue light emitting layer 33 match with the abilities of the red light emitting layer 31 and the green light emitting layer 32 to transport electrons, so that electrons can be transported from the cathode 2 to the red light emitting layer 31 and/or the green light emitting layer 32 quickly when the red light emitting layer 31 and/or the green light emitting layer 32 is required to emit light. This ensures that the electrons and the holes can only meet and recombine within the red light emitting layer 31 and/or within the green light emitting layer 32, but would not recombine within and at the edge of the first portion of the blue light emitting layer, avoiding the problem that when the red light emitting layer 31 and/or the green light emitting layer 32 is required to emit light, the first portion of the blue light emitting layer will also emit light.

The organic electroluminescent device according to an embodiment of the present disclosure does not require the HCL used in the prior art, thereby simplifying the structure of the organic electroluminescent device and enabling the organic electroluminescent device to be more light-weighted.

Because the above blue light emitting layer 33 emits blue light using the blue light exciplex 4 formed within it, it is required that the singlet state energy level $S_{1exciplex}$ of the blue light exciplex 4 formed is greater than 2.5 eV, so as to ensure that the blue light emitting layer 33 can emit blue light that meets the requirement.

The proportions of the electron transport material and the hole transport material in the blue light emitting layer 33 can be determined based on the types of materials actually used by the red light emitting layer 31 and the green light emitting layer 32. It includes (but not limited to) several cases as follows.

In a first case, when the ability of the red light emitting layer 31 to transport electrons is greater than its ability to transport holes, and when the ability of the green light emitting layer 32 to transport electrons is greater than its ability to transport holes, the proportion occupied by the electron transport material of the blue light emitting layer 33 in all materials of the blue light emitting layer 33 is less than the proportion occupied by the hole transport material in all materials of the blue light emitting layer 33. Specifically, when the materials used in the red light emitting layer 31 and the green light emitting layer 32 are both partial to the electron transport material, the abilities of the red light emitting layer 31 and the green light emitting layer 32 to transport electrons are both greater than their abilities to transport holes. Thus, the proportion of the electron transport material in the blue light emitting layer 33 can be reduced, i.e., enabling the blue light emitting layer 33 to have less ability to transport electrons. This ensures that when the red light emitting layer 31 and/or the green light emitting layer 32 is required to emit light, the electrons and the holes can only meet and recombine within the red light emitting layer 31 and/or the green light emitting layer 32, but would not meet within the first portion of the blue light emitting layer 33 or at the border between the first portion of the blue light emitting layer 33 and the red light emitting layer 31 or the green light emitting layer 32. This helps to avoid the problem that when the red light emitting layer 31 and/or the green light emitting layer 32 emits light, the first portion of the blue light emitting layer 33 will also emit light. It should be noted that the electrons and the holes can recombine in the second portion of the blue light emitting layer 33 and emit blue light, while the red light emitting layer and/or the green light emitting layer 32 emit light.

In a second case, when the ability of the red light emitting layer 31 to transport electrons is less than its ability to transport holes, and the ability of the green light emitting layer 32 to transport electrons is less than its ability to transport holes, the proportion occupied by the electron transport material of the blue light emitting layer 33 in all materials of the blue light emitting layer 33 is greater than the proportion occupied by the hole transport material in all materials of the blue light emitting layer 33. More specifically, when the materials used in the red light emitting layer 31 and the green light emitting layer 32 are both partial to the hole transport material, the abilities of the red light emitting layer 31 and the green light emitting layer 32 to transport electrons are both less than their abilities to transport holes. Thus, the proportion of the electron transport material in the blue light emitting layer 33 can be increased, i.e., enabling the blue light emitting layer 33 to have greater ability to transport electrons. This helps to ensure that when the red light emitting layer 31 and/or the green light emitting layer 32 is required to emit light, the electrons and the holes can only meet and recombine within the red light emitting layer 31 and/or the green light emitting layer 32, but would not meet within the first portion of the blue light emitting layer 33 or at the border between the first portion of the blue light emitting layer 33 and the red light emitting layer 31 or the green light emitting layer 32. In addition, the electrons and the holes can recombine in the second portion of the blue light emitting layer 33 and emit blue light, while the red light emitting layer and/or the green light emitting layer 32 emit light.

In order to increase the light emitting efficiency of the blue light emitting layer 33, when selecting the electron transport material and the hole transport material of the blue light emitting layer 33, it should be ensured that the blue light exciplex 4 formed by the electron transport material and the hole transport material has relatively close triplet state energy level and singlet state energy level. Thus, the excitons formed by recombination of the electrons and the holes can transition from the triplet state energy level $T_{1exciplex}$ of the blue light exciplex 4 to the singlet state energy level $S_{1exciplex}$ of the blue light exciplex 4, thereby emitting blue thermally activated delayed fluorescence and ensuring a relatively high utilization rate of the excitons. According to an embodiment of the present disclosure, the energy level difference between the triplet state energy level $T_{1exciplex}$ of the blue light exciplex 4 and the singlet state energy level $S_{1exciplex}$ of the blue light exciplex 4 is less than 0.3 eV. Thus, the excitons formed by recombination can transition from the triplet state energy level $T_{1exciplex}$ of the blue light exciplex 4 to the singlet state energy level $S_{1exciplex}$ of the blue light exciplex 4 more easily, enabling excitons to achieve an utilization rate of 100%, and ensuring the light emitting efficiency of the blue light emitting layer 33.

Figure 3:
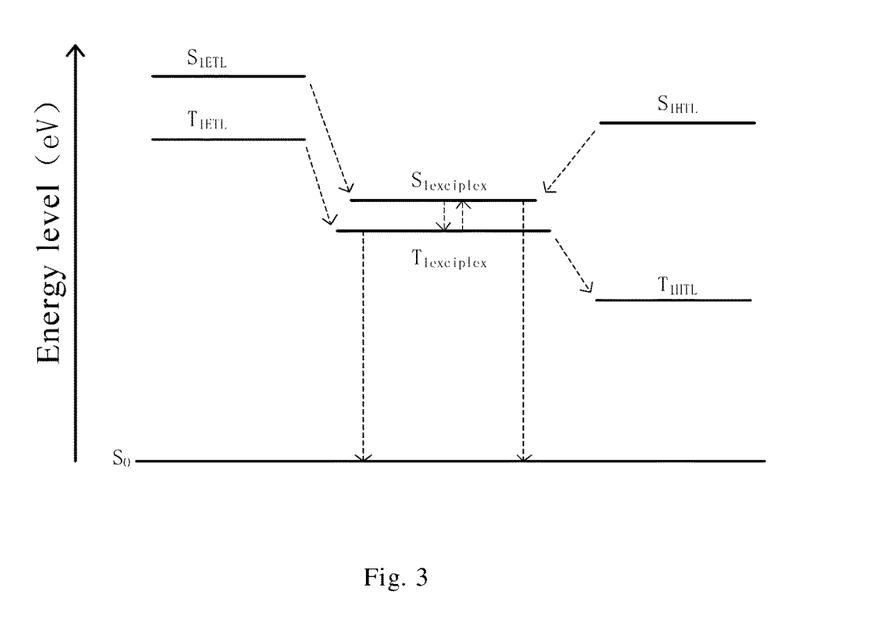
FIG. 3 is a schematic view for a first energy level of the blue light emitting layer in the organic electroluminescent device according to an embodiment of the present disclosure.
Figure 4:
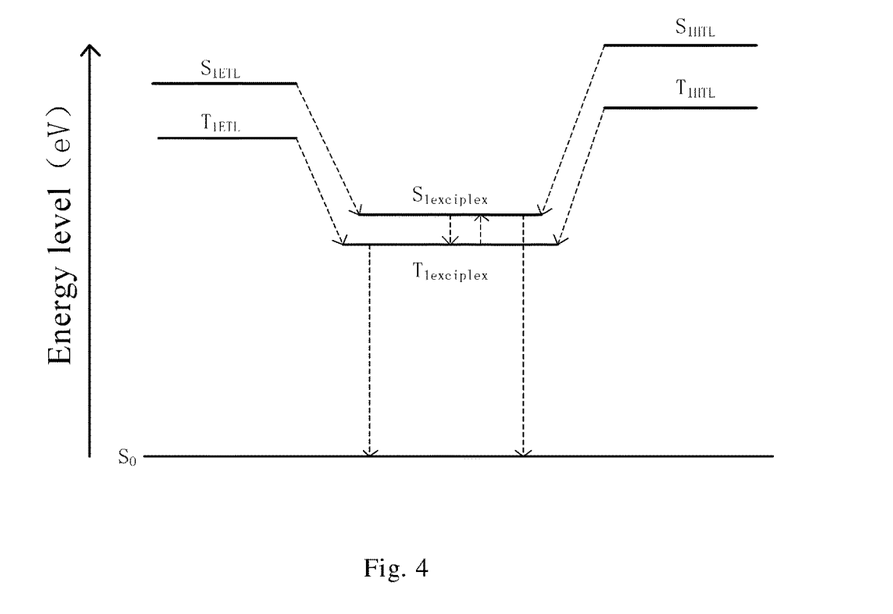
FIG. 4 is a schematic view for a second energy level of the blue light emitting layer in the organic electroluminescent device according to an embodiment of the present disclosure.

FIG. 3 is a schematic view for a first energy level of the blue light emitting layer in the organic electroluminescent device according to an embodiment of the present disclosure. FIG. 4 is a schematic view for a second energy level of the blue light emitting layer in the organic electroluminescent device according to an embodiment of the present disclosure.

Referring to FIG. 3, $S_{1ETL}$ represents the singlet state energy level of the electron transport material in the blue light emitting layer 33, $S_{1HTL}$ represents the singlet state energy level of the hole transport material in the blue light emitting layer 33, and $S_0$ represents the energy level of the ground state. Because the blue light exciplex 4 is formed by the electron transport material and the hole transport material in the blue light emitting layer 33, a case where energy transfers from the triplet state energy level $T_{1exciplex}$ of the blue light exciplex 4 to the triplex state energy level $T_{1ETL}$ of the electron transport material in the blue light emitting layer 33, or to the triplet state energy level $T_{1HTL}$ of the hole transport material in the blue light emitting layer 33 may occur easily. This results in loss of energy and influences the light emitting efficiency of the blue light emitting layer 33.

In order to avoid problems such as low light emitting efficiency caused by energy transfer, the triplet state energy level $T_{1ETL}$ of the electron transport material in the blue light emitting layer 33 is greater than the triplet state energy level $T_{1exciplex}$ of the blue light exciplex 4, and/or, the triplet state energy level $T_{1HTL}$ of the hole transport material in the blue light emitting layer 33 is greater than the triplet state energy state $T_{1exiplex}$ of the blue light exciplex 4, as shown in FIG. 4.

More specifically, when the triplet state energy level $T_{1ETL}$ of the electron transport material in the blue light emitting layer 33 is greater than the triplet state energy level $T_{1exciplex}$ of the blue light exciplex 4, the excitons will not transition from the triplet state energy level $T_{1exciplex}$ of the blue light exciplex 4 to the triplet state energy level $T_{1ETL}$ of the electron transport material easily, i.e., enabling the excitons to be limited in the blue light exciplex 4. Similarly, when the triplet state energy level $T_{1HTL}$ of the hole transport material in the blue light emitting layer 33 is greater than the triplet state energy state $T_{1exiplex}$ of the blue light exciplex 4, the excitons will not transition from the triplet state energy level $T_{1exciplex}$ of the blue light exciplex 4 to the triplet state energy level $T_{1HTL}$ of the hole transport material easily, i.e., enabling the excitons to be limited in the blue light exciplex 4. Hence, the triplet state energy level $T_{1ETL}$ of the electron transport material and the triplet state energy level $T_{1HTL}$ of the hole transport material in the blue light emitting layer 33 are both greater than the triplet state energy level $T_{1exciplex}$ of the blue light exciplex 4. In this way, the excitons can be limited in the blue light exciplex 4, and energy transfer will not occur, which avoids loss of energy and ensures the blue light emitting layer 33 to have a relatively high light emitting efficiency.

It should be noted that the bi-directional dotted arrows between the triplet state energy level $T_{1exciplex}$ and the singlet state energy level $S_{1exciplex}$ of the blue light exciplex 4 in FIG. 3 and FIG. 4 represent that the excitons can transition bi-directionally between the triplet state energy level $T_{1exciplex}$ and the singlet state energy level $S_{1exciplex}$.

In order to ensure the light emitting efficiencies of the red light emitting layer 31 and the green light emitting layer 32, the triplet state energy level $T_{1ETL}$ of the electron transport material in the blue light emitting layer 33 can be greater than the triplet state energy level of the light emitting material in the green light emitting layer 32, and/or, the triplet state energy level $T_{1HTL}$ of the hole transport material in the blue light emitting layer 33 can be greater than the triplet state energy level of the light emitting material in the green light emitting layer 32. The triplet state energy level $T_{1ETL}$ of the electron transport material in the blue light emitting layer 33 is greater than the triplet state energy level of the light emitting material in the green light emitting layer 32. In this case, the excitons in the green light emitting layer 32 cannot transition to the blue light emitting layer 33 easily, so as to limit energy transfer in the green light emitting layer 32, and ensure the light emitting efficiency of the green light emitting layer 32. Similarly, the triplet state energy level $T_{1HTL}$ of the hole transport material in the blue light emitting layer 33 is greater than the triplet state energy level of the light emitting material in the green light emitting layer 32, so that the excitons in the green light emitting layer 32 also cannot transition to the blue light emitting layer 33 easily, thereby ensuring the light emitting efficiency of the green light emitting layer 32.

The triplet state energy level $T_{1ETL}$ of the electron transport material and the triplet state energy level $T_{1HTL}$ of the hole transport material in the blue light emitting layer 33 are both greater than the triplet state energy level of the light emitting material in the green light emitting layer 32. Thus, transition of the excitons in the green light emitting layer 32 is limited to the most extent, and the energy in the green light emitting layer 32 is completely limited in the green light emitting layer 32. This will not result in energy transfer and improves the light emitting efficiency of the green light emitting layer 32 to the most extent.

It should be noted that because the energy level of the light emitting material in the green light emitting layer 32 is generally higher than the energy level of the light emitting material in the red light emitting layer 31, when it is defined that the triplet state energy level $T_{1ETL}$ of the electron transport material and the triplet state energy level $T_{1HTL}$ of the hole transport material in the blue light emitting layer 33 are both greater than the triplet state energy level of the light emitting material in the green light emitting layer 32, it is also defined that the triplet state energy level $T_{1ETL}$ of the electron transport material and the triplet state energy level $T_{1HTL}$ of the hole transport material in the blue light emitting layer 33 are both greater than the triplet state energy level of the light emitting material in the red light emitting layer 31. That is, energy in the red light emitting layer 31 is limited in the red light emitting layer completely, which will not result in energy transfer and improves the light emitting efficiency of the red light emitting layer 31 to the most extent.

The above blue light emitting layer 33 is further used for transporting the electrons from the cathode 2 to the red light emitting layer 31 and the green light emitting layer 32, so as to enable the electrons and the holes to recombine in the red light emitting layer 31 and the green light emitting layer 32, so that the red light emitting layer 31 and the green light emitting layer 32 can emit light. For a better ability of electron transport, the thickness of the blue light emitting layer 33 can be set in a range of nm-40 nm, so as to not only ensure the electron transport speed but also meet the requirement of optical characteristics.

Referring to FIG. 1 again, the organic electroluminescent device according to an embodiment of the present disclosure can further comprise an electron injection layer 5, an electron transport layer 6, a hole injection layer 7 and a hole transport layer 8, so as to ensure transport of electrons from the cathode 2 to the light emitting unit 30 and transport of holes from the anode 1 to the light emitting unit 30 to the most extent. Specifically, the hole injection layer 7 is arranged between the anode 1 and the light emitting unit 30, the hole transport layer 8 is arranged between the hole injection layer 7 and the light emitting unit 30, the electron transport layer 6 is arranged between the light emitting unit 30 and the cathode 2, and the electron injection layer 5 is arranged between the electron transport layer 6 and the cathode 2.

The electron injection layer 5 and the electron transport layer 6 on one hand can transport the electrons from the cathode 2 to the light emitting unit 30 better, and on the other hand, can prevent transport of the holes to the cathode 2. The hole injection layer 7 and the hole transport layer 8 on one hand can transport the holes from the anode 1 to the light emitting unit better, and on the other hand, can prevent transport of the electrons to the anode 1. Therefore, the electron injection layer 5, the electron transport layer 6, the hole injection layer 7 and the hole transport layer 8 can limit both the electrons and the holes in the light emitting unit 30 of the organic electroluminescent device, so as to enable the organic electroluminescent device to achieve the light emitting efficiency to the most extent.

Figure 5:
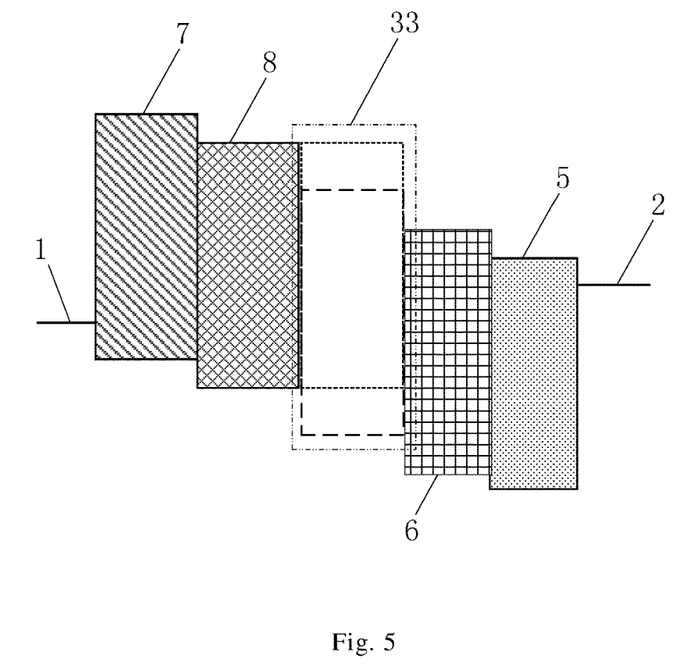
FIG. 5 is a schematic view for a first energy level if only a blue light emitting layer is comprised by the light emitting unit in the organic electroluminescent device according to an embodiment of the present disclosure.
Figure 6:
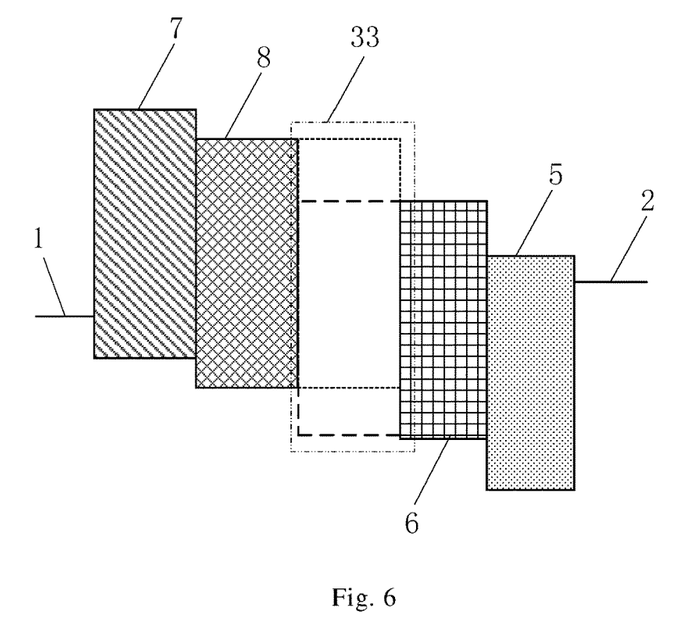
FIG. 6 is a schematic view for a second energy level if only a blue light emitting layer is comprised by the light emitting unit in the organic electroluminescent device according to an embodiment of the present disclosure.

FIG. 5 is a schematic view for a first energy level if only a blue light emitting layer is comprised by the light emitting unit in the organic electroluminescent device according to an embodiment of the present disclosure. FIG. 6 is a schematic view for a second energy level if only a blue light emitting layer is comprised by the light emitting unit in the organic electroluminescent device according to an embodiment of the present disclosure.

The electron transport layer 6 can use various electron transport materials, as long as it is benefit for transport of the electrons. As shown in FIG. 5, the dotted frame at a relatively high position in the blue light emitting layer 33 represents an energy level corresponding to the hole transport material, while the dotted frame at a relatively low position represents an energy level corresponding to the electron transport material. The electron transport material used by the electron transport layer 6 is different from the electron transport material in the blue light emitting layer 33. In such a case, a potential barrier exists between the electron transport layer 6 and the blue light emitting layer 33. Thus, when the electrons are transported by the electron transport layer 6 to the blue light emitting layer 33, part of the energy has to be consumed.

Because the electron transport layer 6 is arranged on the blue light emitting layer 33 by superposition, and the blue light emitting layer 33 comprises the electron transport material, the electron transport layer 6 and the blue light emitting layer 33 can comprise the same electron transport material, so that no potential barrier exists between the electron transport layer 6 and the blue light emitting layer 33. As shown in FIG. 6, the dotted frames in the electron transport layer 6 and in the blue light emitting layer 33 that represent the energy level of the electron transport material are at the same height. Thus, when the electrons are injected by the electron transport layer 6 to the blue light emitting layer 33, no energy has to be consumed. Hence, the driving voltage for driving the organic electroluminescent device to work is reduced, and then the energy consumption of the organic electroluminescent device is reduced.

The blue light emitting layer 33 can use various electron transport materials and hole transport materials, as long as they can form the blue light exciplex 4. According to an embodiment of the present disclosure, the electron transport material in the blue light emitting layer 33 can be 4, 6-bis (3,5-two (3-pyridine) phenyl)-2-methyl pyrimidine (B3PYMPM), and the hole transport material can be 4, 4', 4''-three (carbazole-9-radical) triphenylamine (TCTA). Using 4, 6-bis (3, 5-two (3-pyridine) phenyl)-2-methyl pyrimidine and 4, 4', 4''-three (carbazole-9-radical) triphenylamine to form the blue light emitting layer 33 not only enables the blue light emitting layer 33 to have better abilities of electron transport and hole transport, but also enable the blue light exciplex 4 formed in the blue light emitting layer 33 to have a higher light emitting efficiency. According to an embodiment of the present disclosure, the material of the anode 1 can select ITO, the material of the electron injection layer 5 can select LiF, and the material of the cathode 2 can select Al.

An embodiment of the present disclosure further provides a display device, comprising the organic electroluminescent device according to an embodiment of the present disclosure. Thus, when the red light emitting layer and/or the green light emitting layer is required to emit light, the portion of the blue light emitting layer that covers the red light emitting layer and the green light emitting layer will not emit light. In addition, the display device according to an embodiment of the present disclosure has a higher display efficiency and display image quality. Also, such a display device is more light-weighted.

In the above description of the implementations, the specific features, structures, materials or characteristics can be combined in an appropriate manner in any one or more embodiments or examples.

What are stated above are only specific implementations of the present disclosure, however, the protection scope of the present disclosure is not limited to this. Any modifications or replacements that can be easily conceived by the skilled person familiar with the present technical field within the technical scope disclosed by the present disclosure should be covered within the protection scope of the present disclosure. Therefore, the protection scope of the present disclosure should be subject to the protection scopes of the claims.

The invention claimed is:

1. An organic electroluminescent device, comprising an anode and a cathode arranged oppositely, as well as a light emitting unit that is arranged between the anode and the cathode and is formed by a hybrid process, the light emitting unit comprising a red light emitting layer, a green light emitting layer and a blue light emitting layer, wherein the blue light emitting layer comprises a first portion and a second portion, the first portion of the blue light emitting layer covers the red light emitting layer and the green light emitting layer that are arranged side by side, and the second portion of the blue light emitting layer is arranged side by side with the red light emitting layer and the green light emitting layer, wherein a material of the blue light emitting layer comprises an electron transport material and a hole transport material that can form a blue light exciplex, proportions respectively occupied by the electron transport material and the hole transport material of the blue light emitting layer in all materials of the blue light emitting layer match with abilities of the red light emitting layer and the green light emitting layer to transport electrons, so that electrons and holes would not recombine within and at an edge of the first portion of the blue light emitting layer when at least one of the red light emitting layer and the green light emitting layer is required to emit light, wherein, the ability of the red light emitting layer to transport electrons is greater than its ability to transport holes, the ability of the green light emitting layer to transport electrons is greater than its ability to transport holes, and a proportion occupied by the electron transport material of the blue light emitting layer in all materials of the blue light emitting layer is less than a proportion occupied by the hole transport material of the blue light emitting layer in all materials of the blue light emitting layer; or, the ability of the red light emitting layer to transport electrons is less than its ability to transport holes, the ability of the green light emitting layer to transport electrons is less than its ability to transport holes, and a proportion occupied by the electron transport material of the blue light emitting layer in all materials of the blue light emitting layer is greater than a proportion occupied by the hole transport material of the blue light emitting layer in all materials of the blue light emitting layer.

2. The organic electroluminescent device according to claim 1, wherein an energy level difference between a triplet state energy level of the blue light exciplex and a singlet state energy level of the blue light exciplex is less than 0.3 eV.

3. The organic electroluminescent device according to claim 1, wherein, a triplet state energy level of the electron transport material in the blue light emitting layer is greater than a triplet state energy level of the blue light exciplex, and/or, a triplet state energy level of the hole transport material in the blue light emitting layer is greater than a triplet state energy level of the blue light exciplex.

4. The organic electroluminescent device according to claim 1, wherein, a triplet state energy level of the electron transport material in the blue light emitting layer is greater than a triplet state energy level of a light emitting material in the green light emitting layer, and/or, a triplet state energy level of the hole transport material in the blue light emitting layer is greater than the triplet state energy level of the light emitting material in the green light emitting layer.

5. The organic electroluminescent device according to claim 1, wherein a thickness of the blue light emitting layer is between 20 nm and 40 nm.

6. The organic electroluminescent device according to claim 1, further comprising: a hole injection layer, a hole transport layer, an electron transport layer and an electron injection layer, wherein, the hole injection layer is arranged between the anode and the light emitting unit;

the hole transport layer is arranged between the hole injection layer and the light emitting unit;

the electron transport layer is arranged between the light emitting unit and the cathode; and the electron injection layer is arranged between the electron transport layer and the cathode.

7. The organic electroluminescent device according to claim 6, wherein an electron transport material in the electron transport layer is same as an electron transport material in the blue light emitting layer.

8. The organic electroluminescent device according to claim 1, wherein, the electron transport material in the blue light emitting layer is 4, 6-bis (3, 5-two (3-pyridine) phenyl)-2-methyl pyrimidine, and the hole transport material in the blue light emitting layer is 4, 4', 4"-three (carbazole-9-radical) triphenylamine.

9. A display device, comprising the organic electroluminescent device according to claim 1.

10. The display device according to claim 9, wherein an energy level difference between a triplet state energy level of the blue light exciplex and a singlet state energy level of the blue light exciplex is less than 0.3 eV.

11. The display device according to claim 9, wherein, a triplet state energy level of the electron transport material in the blue light emitting layer is greater than a triplet state energy level of the blue light exciplex, and/or, a triplet state energy level of the hole transport material in the blue light emitting layer is greater than a triplet state energy level of the blue light exciplex.

12. The display device according to claim 9, wherein, a triplet state energy level of the electron transport material in the blue light emitting layer is greater than a triplet state energy level of a light emitting material in the green light emitting layer, and/or, a triplet state energy level of the hole transport material in the blue light emitting layer is greater than the triplet state energy level of the light emitting material in the green light emitting layer.

13. The display device according to claim 9, wherein a thickness of the blue light emitting layer is between 20 nm and 40 nm.

14. The display device according to claim 9, further comprising: a hole injection layer, a hole transport layer, an electron transport layer and an electron injection layer, wherein, the hole injection layer is arranged between the anode and the light emitting unit;

the hole transport layer is arranged between the hole injection layer and the light emitting unit;

the electron transport layer is arranged between the light emitting unit and the cathode; and the electron injection layer is arranged between the electron transport layer and the cathode.

15. The display device according to claim 14, wherein an electron transport material in the electron transport layer is same as an electron transport material in the blue light emitting layer.

16. The display device according to claim 9, wherein,
the electron transport material in the blue light emitting layer is 4, 6-bis (3, 5-two (3-pyridine) phenyl)-2-methyl pyrimidine, and
the hole transport material in the blue light emitting layer is 4, 4', 4"-three (carbazole-9-radical) triphenylamine.

* * * * *